United States Patent [19]

Itozaki et al.

[11] Patent Number: 5,189,011
[45] Date of Patent: Feb. 23, 1993

[54] SUPERCONDUCTING MATERIAL AND METHOD FOR PREPARING THE SAME (SR, $\gamma)_x$(LA, $\delta)_{1-x}\epsilon_y$CU$_{1-y}$O$_{3-z}$

[75] Inventors: Hideo Itozaki; Saburo Tanaka; Nobuhiko Fujita; Shuji Yazu; Tetsuji Jodai, all of Hyogo, Japan

[73] Assignee: Sumitomo Electric Industries, Ltd., Osaka, Japan

[21] Appl. No.: 815,576

[22] Filed: Dec. 27, 1991

Related U.S. Application Data

[63] Continuation of Ser. No. 601,050, Oct. 23, 1990, abandoned, which is a continuation of Ser. No. 224,373, Jul. 26, 1988, abandoned.

[30] Foreign Application Priority Data

Jul. 26, 1987 [JP] Japan .................. 62-185726

[51] Int. Cl.$^5$ .................. C01F 17/00; C01G 3/02; C01G 29/00; H01L 39/12
[52] U.S. Cl. .................. 505/1; 252/518; 252/521; 505/782
[58] Field of Search .................. 252/518, 521; 505/1, 505/782, 776, 777, 778, 779, 780

[56] References Cited

PUBLICATIONS

Maeda "A New High-Tc Oxide Superconductor without a Rare Earth" Jpn. Jnl. of Appl. Phys. vol. 27, No. 2, Feb. 1988 pp. L209-L210.

Primary Examiner—Paul Lieberman
Assistant Examiner—John Boyd
Attorney, Agent, or Firm—Kerkam, Stowell, Kondracki & Clarke

[57] ABSTRACT

A now superconducting material comprising a compound oxide represented by the general formula:

$$(Sr,\gamma)_x(La,\delta)_{1-x}\epsilon_yCu_{1-y}O_{3-z}$$

in which
"$\gamma$" represents an element of IIa group of the periodic table except Sr, an atomic ratio of $\gamma$ to Sr being selected in a range between 1% and 90%,
"$\delta$" represents an element of IIIa group of the periodic except La, an atomic ratio of $\delta$ to La is selected in a range between 1% and 90%,
"$\epsilon$" represents a metal element of Vb group of the periodic table, x, y and z are numbers each satisfies ranges of $0 \leq x \leq 1, 0 \leq y \leq 1$, and $0 \leq z \leq 1$ respectively, and the expression of (Sr,$\gamma$) and (La,$\delta$) mean that the respective elements position predetermined sites in a crystal in a predetermined proportion.

5 Claims, No Drawings

SUPERCONDUCTING MATERIAL AND METHOD FOR PREPARING THE SAME $(Sr, \gamma)_x(La, \delta)_{1-x}\epsilon_y Cu_{1-y}O_{3-z}$ This is a continuation of application Ser. No. 07/601,050, filed Oct. 23, 1990, now abandoned, which is a continuation of application Ser. No. 07/224,373, filed Jul. 26, 1988, both now abandoned.

BACKGROUND OF THE INVENTION

1. Field of the Invention

The present invention relates to a superconducting material and a method for preparing the same. More particularly, it relates to a novel superconducting material composed of compound oxide having a higher critical temperature and a method for preparing the same.

2. Description of the Related Art

Under the phenomenon of superconductivity, the perfect diamagnetism is observed and no difference in potential is observed for all that an electric current of a constant finite value is observed internally.

The superconductivity can be utilized in the field of power electric applications such as MHD power generation, fusion power generation, power transmission, electric power reservation or the like; in the field of transportation for example magnetic levitation trains, magnetically propelling ships or the like; in the medical field such as high-energy beam radiation unit; in the field of science such as NMR or high-energy physics; a high sensitive sensors or detectors for sensing very weak magnetic field, microwave, radiant ray or the like, or in the field of fusion power generation. In addition to the abovementioned power electric applications, the superconducting materials can be used in the field of electronics, for example, as a device using the Josephson device which is expected to be a high-speed and low-power consuming switching device.

The phenomenon of superconductivity, however, is observed only at very low cryogenic temperatures. In fact, a relatively lower temperature of 23.2 K. which was the critical temperature (Tc) of a superconductor composed of Nb$_3$Ge have been the top record of the critical temperature among known superconducting materials.

This means that liquidized helium (boiling point of 4.2 K.) is only one cryogen which can realize such very low temperature of Tc. However, helium is not only a limited costly resource but also require a large-scaled system for liquefaction. Therefore, there had been a strong demand for another superconducting materials having higher Tc. But no material which exceeded the abovementioned Tc had been found for all studies for the past ten years.

Possibility of existence of a new type of superconducting materials having much higher Tc was revealed by Bednorz and Müller who discovered a new oxide type superconductor in 1986 [Z. Phys. B64 (1986) 189]. It was also reported in the news paper that C. W. Chu et al. discovered in the United States of America another superconducting material so called YBCO type represented by YBa$_2$Cu$_3$O$_{7-x}$ having the critical temperature of about 90 K. in February 1987. And hence, possibility of existence of high-temperature superconductors have burst on the scene.

It had been known that certain ceramics material of compound oxides exhibit the property of superconductivity. For example, U.S. Pat. No. 3,932,315 discloses Ba-Pb-Bi type compound oxide which shows superconductivity and Japanese patent laid-open No. 60-173,885 discloses that Ba-Bi type compound oxides also show superconductivity. These superconductors, however, possess rather lower transition temperatures of about 10 K. and hence usage of liquidized helium (boiling point of 4.2 K.) as cryogen had been indispensable to realize superconductivity. Therefore, the abovementioned new type compound oxides in which superconductivity is realized in liquid nitrogen which is a relatively cheap cryogen will accelerate actual usage of superconductors.

An object of the present invention is to provide a new system of compound oxide which possess a higher critical temperature and a method for preparing the same.

SUMMARY OF THE INVENTION

A superconducting material according to the present invention is composed of a compound oxide represented by the general formula:

$$(Sr, \gamma)_x(La, \delta)_{1-x}\epsilon_y Cu_{1-y}O_{3-z}$$

in which

"$\gamma$" represents an element of IIa group of the periodic table except Sr, an atomic ratio of $\gamma$ to Sr being selected in a range between 1% and 90%, "$\delta$" represents an element of IIIa group of the periodic except La, an atomic ratio of $\delta$ to La is selected in a range between 1% and 90%, "$\epsilon$" represents a metal element of Vb group of the periodic table, x, y and z are numbers each satisfies ranges of $0 \leq x \leq 1$, $0 \leq y \leq 1$, and $0 \leq z < 1$ respectively, and the expression of (Sr, $\gamma$) and (La, $\delta$) mean that the respective elements position predetermined sites in a crystal in a predetermined proportion.

A process for producing a superconducting material according to the present invention comprise preparing a material powder, compacting the material powder and then subjecting the resulting compact to a final sintering operation, the process is characterized in that said material powder is selected from a group comprising following (A), (B) and (C):

(A) a powder mixture composed of powders selected from a group comprising (i) powders of elements Sr, La, Cu, $\gamma$, $\delta$ and $\epsilon$ and (ii) powders of compounds each containing at least one of said elements Sr, La, Cu, $\gamma$, $\delta$ and $\epsilon$, (B) a sintered powder obtained by sintering preliminarily the powder mixture (A) and then pulverizing a sintered mass, or (C) a powder mixture of said powder mixture (A) and said sintered powder (B), in which, "$\gamma$" represents an element of IIa group of the periodic table except Sr, "$\delta$" represnets an element of IIIa group of the periodic except La, and "$\epsilon$" represents a metal element of Vb group of the periodic table, wherein, an atomic ratio of (Sr, $\gamma$):(La, $\delta$):$\epsilon$:Cu in said material powder satisfies a ratio of $x:(1-x):y:(1-y)$, in which an atomic ratio of $\gamma$ to Sr is selected in a range between 1% and 90%, an atomic ratio of $\delta$ to La is selected in a range between 1% and 90%, x and y are numbers each satisfies ranges of $0 \leq x \leq 1$ and $0 \leq y \leq 1$ respectively.

The sintered compact obtained by the abovementioned process is composed of so-called quasi-perovskite type compound oxide which is represented by the general formula:

$$(Sr, \gamma)_x(La, \delta)_{1-x}\epsilon_y Cu_{1-y}O_{3-z}$$

in which
"γ" represents an element of IIa group of the periodic table except Sr, an atomic ratio of γ to Sr being selected in a range between 1% and 90%,
"δ" represents an element of IIIa group of the periodic except La, an atomic ratio of δ to La is selected in a range between 1% and 90%,
"ε" represents a metal element of Vb group of the periodic table,
x, y and z are numbers each satisfies ranges of $0 \leq x \leq 1$, $0 \leq y \leq 1$, and $0 \leq z < 1$ respectively, and
the expression of (Sr, γ) and (La, δ) mean that the respective elements position predetermined sites in a crystal in a predetermined proportion.

The atomic ratio of γ with respect to Sr can be selected in a range between 1% and 90% but a preferred result is obtained in a range between 1% and 50%. Still more, there is such tendency that preferable properties as superconductors are obtained when the value of x is selected in a range of $0.3 \leq x \leq 0.4$.

The essence of the present invention resides in that the compound oxide is composed of specified elements and oxygen. This is a unique point of the present invention, comparing to the abovementioned known new type superconductors composed of four elements. Namely, the compound oxide according to the present invention, two pairs of elements each pair of which belongs to the same group of the periodic table. It is thought that an advantageous result of the present invention is obtained when each of these elements occupies a predetermined site in the crystal in a predetermined proportion.

We found that precise control of the following factors is indispensable in order to obtain a sintered compound oxide possessing superior superconducting properties:

(i) particle size of the material powder,
(ii) temperature during the preliminary sintering operation,
(iii) particle size of the preliminary sintered and pulverized powder, and
(iv) temperature during the final sintering operation.

In fact, if an average particle size of the material powder exceed 10 μm, a fine particle which is satisfactory in uniformity can not be obtained easily even after such material powder is subjected to the preliminary sintering operation. Therefore, the average particle size of the material powder is preferably less than 10 μm.

In case that a sintered powder (B) which is prepared by preliminary sintering of the powder mixture (A) is used as the material powder, the preliminary sintering is preferably carried out at a temperature which is higher than 700° C. but is not higher than the lowest melting point of any compound which is contained in the powder mixture (A) for a duration of from 1 to 50 hours and preferably in an atmosphere containing oxygen gas of $10^{-3}$ to $10^2$ Torr. It is also preferable that, after the preliminary sintering complete, the resulting sintered mass is cooled at a cooling rate which is not slower than 1° C./min but not higher than 1,000° C./min. A particle size of the pulverized powder obtained from the preliminary sintered mass influence directly upon a particle size of a crystal which is obtained after the final sintering operation, so that the preliminary sintered mass is preferably pulverized to powder having an average particle size of less than 5 μm. Such fine particles increase the area of grain boundaries which is one of critical factors for realizing the superior superconductor which is particularly improved in the critical temperature of superconductivity. Pulverization or reduction of the preliminary sintered mass to less than 1 μm is not only economical or practicable but also increase possibility of contamination of the material powder. Therefore, the average particle size of the preliminary sintered powder is preferably adjusted to a range between 1 μm and 5 μm.

A series of operations of preliminary sintering, pulverization and compacting is preferably repeated for several times to homogenize the material powder.

The sintering temperature is one of the critical factors in the process for producing the superconduting compound oxide, so that the sintering temperature is controlled and adjusted to a temperature at which the sintering proceed in a solid reaction without substantial fusing of the material powder and excessive crystal growth is not occur in the resulting sintered compound oxide. In fact, the sintering temperature should not exceed the lowest melting point of any component in the material powder such as the powder mixture, the compound powder or the preliminary sintered powder. To the contrary, satisfactory sintering can not be effected if the sintering temperature is too low. Therefore the sintering must be carried out a temperature which is higher than 700° C. Duration of sintering operation is generally for 1 hour to 50 hours in actual practice, although longer sintering time is preferable.

The abovementioned preliminary sintering operation should be also controlled precisely in the same manner as above because of the same reason.

According to a preferred embodiment, the sintered compound oxide is further heat-treated in order to homogenize the crystal structure. This heat-treatment improve the critical temperature and reduce remarkably the discrepancy between the terminal temperature of phase change where perfect zero resistance is observed and the critical temperature.

This heat-treatment is preferably carried out in an oxygen containing atmosphere at a temperature of 500° to 900° C. Under this condition of heat-treatment, the crystal structure of sintered compound oxide is stabilized and the oxygen deficient perovskite structure which is desired for realizing the superconductivity is obtained, resulting in that the lower critical temperature where perfect zero resistance is observed become much higher and a lasting and stable superconductor is assured. If the temperature of heat-treatment is not higher than 500° C. the abovementioned effect is not obtained or it takes longer time before realization of the objective crystal structure. To the contrary, if the temperature of heat-treatment exceed 900° C., the abovementioned perovskite type crystal structure is lost.

The superconducting material according to the present invention can be used in a form of a sintered mass or article as it is and is also used in a form of a powder which is prepared by pulverizing the sintered mass. This powder-formed superconducting compound oxide can be used for producing a superconducting wire or the like. For example, the superconducting compound oxide powder according to the present invention is compacted in a metallic pipe which is then drawn into a fine wire or is mixed with suitable binder such as polybutylbutylal (PVB) to prepare a paste which can be molded into a desired configuration or which is coated or applied in a desired pattern. The resulting wire and the paste molded or coated are then sintered finally.

When the superconducting compound oxide according to the present invention is used in the form of a paste, it is preferable to heat the coated or molded paste at 400° to 700° C. in air before the final sintering operation in order to remove the binder previously.

When a self-supporting article is molded with the paste, it is preferable to select a thickness of the paste to be molded to less than 1.2 mm and when a thick film is coated on a support, the thickness of a layer of paste to be coated on a support is adjusted to less than 0.6 mm. In practice, since a pre-form of paste molded or coated by a doctor blade coating technique or extrusion technique shrink during the final sintering stage, the dimension of the final product becomes smaller. Therefore, when the paste is shaped into a form of a tape or wire or is coated into a thick film, their thickness or diameter of paste molded or coated is preferably controlled to less than 1.2 mm or 0.6 mm respectively.

The superconducting material according to the present invention can be formed into a thin film by the conventional physical vapor deposition (PVD) technique such as vacuum deposition, sputtering, ion-plating or molecular beam epitaxial growth technique in the presence of oxygen gas. In this case, the abovementioned sintered mass or block is used as a vapor source or target which is evaporated in a vacuum chamber to produce a thin film deposited on a substrate. Namely, the vapor source may be a block prepared by sintering the material powder such as (i) powders of metal elements of Sr, La, Cu, $\gamma$, $\delta$ and $\epsilon$ (elements $\gamma$, $\delta$ and $\epsilon$ have the same definition as above) as they are, (ii) a powder mixture of compounds of these elements or (iii) their combination. The vapor source may be a powder which is obtained by pulverizing the sintered block. The proportion or atomic ratio of the elements in the vapor source is selected in such manner that the desired atomic ratio of the elements are realized in the deposited thin film in consideration of vaporization rate or sputtering rate or the like. The oxygen pressure in the vacuum chamber should be controlled so that the partial pressure of oxygen gas is adjusted to a range between $10^{-6}$ and $10^{-2}$ Torr. The substrates on which the thin film are deposited are preferably those that have similar crystal structure or lattice constant and may be a single crystal of MgO, sapphire or $SrTiO_3$. Desirably, the superconducting thin film is deposited on a {001} plane or {110} plane of a single crystal of MgO or $SrTiO_3$ to improve the critical current density (Jc) owing to ordering of crystal to c-axis.

In this case of thin film also, the abovementioned heat-treatment of the deposited thin film is very effective. The heat-treatment is carried out at a temperature of 500° to 900° C. for more than 1 hour in oxygen containing atmosphere in which the partial pressure of oxygen is adjusted to $10^{-3}$ to $10^2$ Torr. After the heat-treatment, the resulting thin film is cooled slowly at a cooling rate of less than 10° C./min.

The superconducting material according to the present invention show a very high critical temperature comparing to the conventional materials. This might come from their characteristic feature of the composition and their uniform and fine crystal structure which is assured by the present process.

The novel superconducting materials according to the present invention have improved stability and a high critical temperature, so that they can realized superconductivity be means of relatively cheaper cryogen in a small liquefication system and hence they can be utilized advantageously in applications of superconducting wire, rod, parts such as magnets, thick film or thin film devices, such as Matisoo switching elements or Josephson device, Anacker memory device, a variety of sensors or Superconducting Quantum Interference Device (SQUID).

Now, embodiments of the process according to the present invention will be described by Examples, but the scope of the present invention should not be limited thereto.

EXAMPLES

Powders of commercially available CuO and carbonate powders of Sr, Ca, La, Sm, Yb and Bi, namely $SrCO_3$, $CaCO_3$, $La_2(CO_3)_3$, $Sm_2(CO_3)_3$, $Yb_2(CO_3)_3$, $(BiO)_2CO_3$ are mixed in such an atomic ratio that satisfies the following general formula:

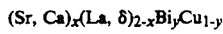

(Sr, Ca)$_x$(La, $\delta$)$_{2-x}$Bi$_y$Cu$_{1-y}$ in which, $\delta$ represents Sm or Yb, the value of x and y are shown in Table 1, and the proportion (%) of Ca with respect to Sr and the propagation (%) of $\delta$ with respect to La are also shown in the Table 1.

The respective powder mixtures are pulverized in a ball mill to be reduced to an average particle size of 4 $\mu$m and then sintered at 750° C. for 15 hours. The resulting sintered mass or cake is pulverized again. The steps of sintering and pulverization are repeated two times under the same condition as above. The finally obtained powder of less than 4 $\mu$m is charged in a rubber mold and compressed hydrostatically under a pressure of 1.5 ton/cm$^2$ to obtain tablets of 4×10×30 mm. The tablets are sintered at 950° C. for 8 hours in air.

Resistance is measured on the tablets on which electrodes are secured with silver electroconductive paste to determine the critical temperature.

Measurement of an upper critical temperature Tc and a lower critical temperature Tcf is effected by a conventional four probe method. Temperature is measured by a calibrated Au(Fe)-Ag thermocouple.

The result are shown in Table 1.

TABLE 1

| Sample No | (Sr,Ca)x (x) | Bi (y) | Ca (%) | $\delta$ | $\delta$ (%) | Tc | Tcf |
|---|---|---|---|---|---|---|---|
| 1 | 0.66 | 0.11 | 10 | Sm | 30 | 148 | 129 |
| 2 | 0.66 | 0.11 | 10 | Yb | 30 | 130 | 116 |

What is claimed is:

1. A superconducting material comprising a compound oxide represented by the general formula:

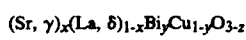

(Sr, $\gamma$)$_x$(La, $\delta$)$_{1-x}$Bi$_y$Cu$_{1-y}$O$_{3-z}$ in which
"$\gamma$" represents Ca or Ba, an atomic ratio of $\gamma$ to Sr being selected in a range between 1% and 90%,
"$\delta$" represents Y or a lanthanide element except La, wherein an atomic ratio of $\delta$ to La is selected in a range between 1% and 90%, x, y and z are numbers each satisfying respective ranges of $0<x<1$, $0<y<1$ and $0\leq z<1$, and the expression of (Sr, $\gamma$) and (La, $\delta$) mean that the respective elements are positioned at predetermined sites in a crystal in a predetermined proportion.

2. A superconducting material set forth in claim 1, characterized in that the atomic ratio of $\gamma$ to Sr is selected in a range between 1% and 50%.

3. A superconducting material set forth in claim 1, characterized in that said superconducting material has perovskite type or quasi-perovskite type crystal structure.

4. A superconducting material set forth in claim 1, characterized in that said superconducting material is in a form of bulk.

5. A superconducting material set forth in claim 1, characterized in that said superconducting material is in a form of paste containing binder.

* * * * *